(12) United States Patent
Huang et al.

(10) Patent No.: US 8,324,668 B2
(45) Date of Patent: Dec. 4, 2012

(54) DUMMY STRUCTURE FOR ISOLATING DEVICES IN INTEGRATED CIRCUITS

(75) Inventors: Li-Ping Huang, Taipei (TW);
Chih-Hsiang Huang, Zhubei (TW); Ka Hing Fung, Hsinchu (TW);
Chung-Cheng Wu, Hsin-Chu (TW);
Haiting Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 234 days.

(21) Appl. No.: 12/640,700

(22) Filed: Dec. 17, 2009

(65) Prior Publication Data
US 2011/0147765 A1    Jun. 23, 2011

(51) Int. Cl.
*H01L 29/76* (2006.01)

(52) U.S. Cl. ......... 257/288; 438/200; 438/209; 438/294

(58) Field of Classification Search .................. 438/200, 438/209, 294
See application file for complete search history.

(56) References Cited

U.S. PATENT DOCUMENTS

| | | | |
|---|---|---|---|
| 5,355,012 A * | 10/1994 | Yamaguchi et al. | 257/409 |
| 2002/0086461 A1* | 7/2002 | Chan | 438/128 |
| 2009/0236633 A1* | 9/2009 | Chuang et al. | 257/190 |
| 2009/0289307 A1* | 11/2009 | Fukui | 257/372 |

* cited by examiner

*Primary Examiner* — Ha Tran T Nguyen
*Assistant Examiner* — Aaron Dehne
(74) *Attorney, Agent, or Firm* — Haynes and Boone, LLP

(57) ABSTRACT

The present disclosure provides an integrated circuit. The integrated circuit includes a first operational device having a first transistor of a first composition; a second operational device having a second transistor of the first composition; and an isolation transistor disposed between the first and second transistors, the isolation transistor having a second composition different from the first composition.

23 Claims, 8 Drawing Sheets

DUMMY STRUCTURE FOR ISOLATING DEVICES IN INTEGRATED CIRCUITS

BACKGROUND

When a semiconductor device such as a metal-oxide-semiconductor field-effect transistor (MOSFET) is scaled down through various technology nodes (e.g., 45 nm, 32 nm, 22 nm, and beyond), device packing density and device performance are challenged by device layout and isolation. In order to avoid leakage between neighboring devices, the following approaches have been applied in standard cell layout design. For example, the standard cell layout adopts an isolated active region island to separate the source of one operational device and the drain of the other operational device, and dummy gate structures of the same type as the operational devices are formed on isolation regions to improve pattern density. As another example, the active region is extended under the dummy gate structures of the same type of as the operational devices to enlarge the epi material of the source and drain regions thereby improving device performance. Although these approaches have been satisfactory for its intended purpose, they have not been satisfactory in all respects.

SUMMARY

One of the broader forms of an embodiment of the present invention involves an integrated circuit. The integrated circuit includes a first operational device having a first transistor of a first composition; a second operational device having a second transistor of the first composition; and an isolation transistor disposed between the first and second transistors, the isolation transistor having a second composition different from the first composition.

Another one of the broader forms of an embodiment of the present invention involves an integrated circuit. The integrated circuit includes a first operational device having a first gate of a first composition; a second operational device having a second gate of the first composition; and an isolation gate disposed between the first and second gates, the isolation gate having a second composition different from the first composition.

Yet another one of the broader forms of an embodiment of the present invention involves an integrated circuit. The integrated circuit includes a semiconductor substrate having a first active region and a second active region; a first field-effect transistor (FET) device disposed within the first active region, the first FET device having a first functional gate electrode; a second FET device disposed within the second active region, the second FET device having a second functional gate electrode; and an isolation gate electrode disposed between the first and second functional gate electrodes, wherein the isolation gate electrode has a first conductivity, and wherein the first and second functional gate electrodes have a second conductivity different from the first conductivity.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
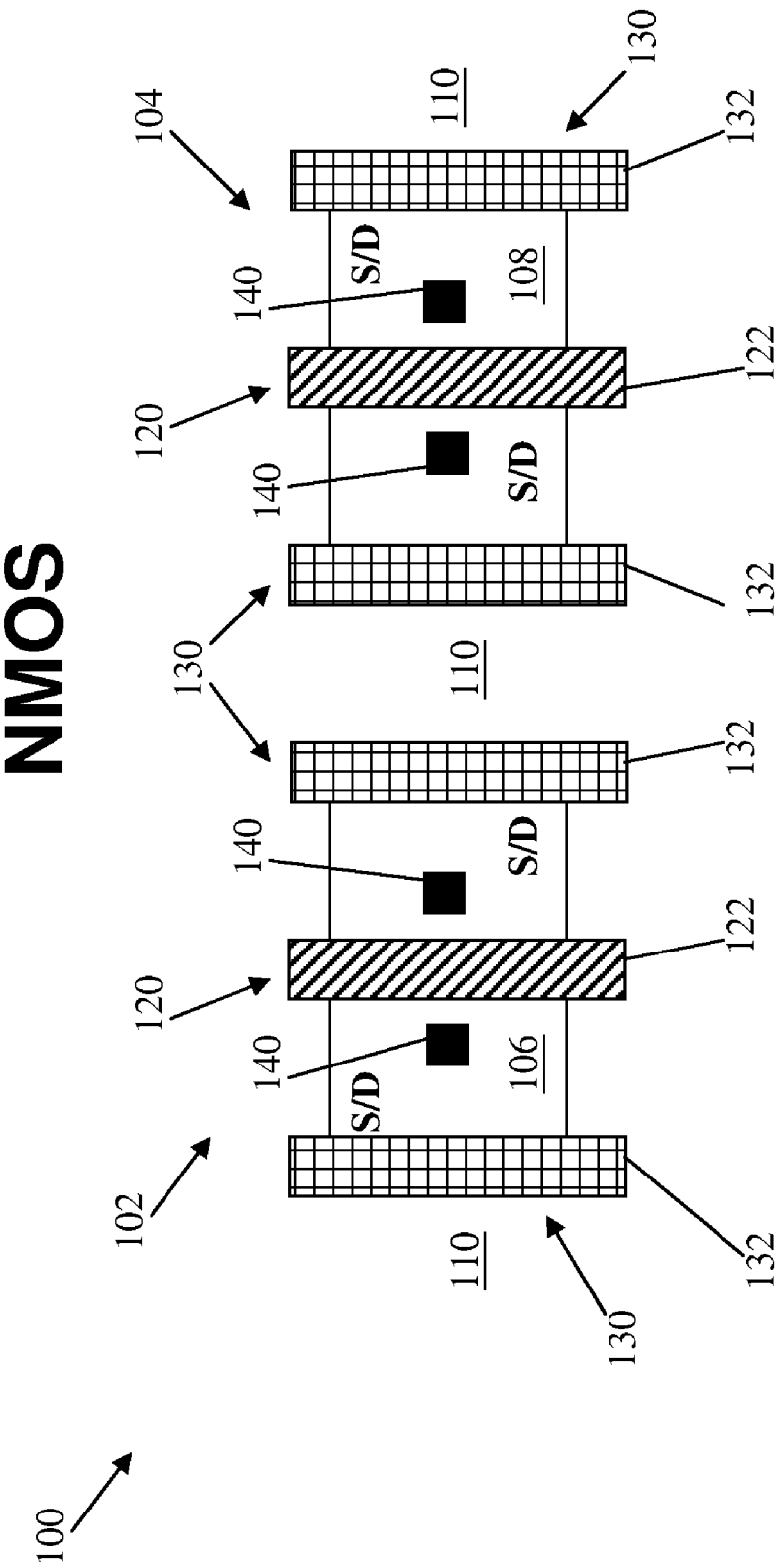
FIGS. 1-8 are top views of various embodiments of a semiconductor device that utilize dummy gate structures for isolating neighboring devices according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a top view of a semiconductor device 100. The semiconductor device 100 includes adjacent/neighboring n-type metal-oxide-semiconductor field-effect transistor (NMOSFET) devices 102 and 104 isolated from each other and from other devices by dummy structures according to an embodiment of the present disclosure. Although only two NMOSFET devices are illustrated, it is understood that more than two devices may be implemented in the semiconductor device 100 as well as reverse type MOSFET devices formed by CMOS technology processing. Further, it is understood that the semiconductor device 100 may also include resistors, capacitors, inductors, diodes, and other suitable microelectronic devices that are typically implemented in integrated circuits. The devices 102 and 104 may be formed within active regions 106 and 108, respectively. The active regions 106 and 108 are defined in a semiconductor substrate.

The semiconductor substrate includes a semiconductor wafer such as a silicon wafer. Alternatively, the substrate may include other elementary semiconductors such as germanium. In an embodiment, the substrate may include an epitaxial layer (epi layer) overlying a bulk semiconductor. Furthermore, the substrate may include a semiconductor-on-insulator (SOI) structure. In various embodiments, the substrate may include a buried layer such as an n-type buried layer (NBL), a p-type buried layer (PBL), and/or a buried dielectric layer including a buried oxide (BOX) layer. In some embodiments, the substrate may include doped features such as an n-well and p-well. In the present embodiment, the substrate includes a p-type doped silicon substrate.

The active regions 106, 108 are surrounded by isolation regions 110, such as shallow trench isolation (STI) features or local oxidation of silicon (LOCOS) features formed in the substrate. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The active regions 106, 108 include source and drain regions (S/D regions). A channel underlying a gate structure 120 is defined in the substrate and configured between the source and drain regions. The channel is strained to enable the carrier mobility of the device and enhance the device performance. Particularly, the source and drain regions are formed by an epitaxy (epi) process to achieve the strained channel. In an embodiment, silicon carbide (SiC) is deposited by an epitaxy process on the silicon substrate to form the source and drain regions. In other embodiments, silicon carbide (SiC) is deposited by an epitaxy process on the silicon substrate and doped with phosphorous to form the source and drain regions. In another embodiment, silicon phosphide (SiP) is deposited by an epitaxy process on the silicon substrate to form the source and drain regions. In still another embodiment, epi silicon (Si) is deposited on the silicon substrate to form source and drain regions. Further, the source and drain regions may be raised above the surface of the substrate.

The gate structure 120 is formed on the substrate and interposed between the source and drain regions. The gate structure 120 may be referred herein as a functional or operational gate structure. The gate structure 120 includes a gate dielectric and a gate electrode 122 formed on the gate dielectric. The gate structure 120 may be formed on a p-well. The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectric may have a multilayer structure such as one layer of silicon oxide and another layer of high k material.

In the present embodiment, the gate electrode 122 includes an n-type work function metal (n-metal) for properly performing as a NMOSFET device. The n-metal may have a work function that is less than about 4.33 eV. For example, the n-metal may include Ti, Al, Zn, Nb, Ag, Mn, Zr, Ta, TiN, TaN, and other suitable metals. The gate electrode 122 may have a multilayer structure and may be formed in a multiple-step process using a combination of different processes. The gate electrode 122 may be formed in a "gate first" or "gate last" approach as is known in the art. Alternatively, the gate electrode 122 may optionally include a polysilicon (poly) layer doped with an n-type dopant such as phosphorous or arsenic.

The semiconductor device 100 further includes dummy gate structures 130 disposed within the active regions 106, 108. That is, an edge of the active region 106, 108 is extended such that it directly underlies the dummy gate structures 130. Accordingly, the epi SiC or epi SiP or epi Si volume is increased thereby reducing a facet profile proximate the STI 110. Thus, device performance may be improved such as Idsat. Further, the increased volume improves alignment of contacts 140 that are subsequently formed on the source and drain regions. In the present embodiment, the dummy gate structures 130 include a dummy gate dielectric and a dummy gate electrode 132 formed on the dummy gate dielectric. The dummy gate structures 130 may be formed on the p-well. The dummy gate dielectric is formed of the same material as the gate dielectric of the functional gate structure 120. However, the dummy gate electrode 132 is formed of a different composition than the gate electrode 122 of the functional gate structure 120. In an embodiment, the dummy gate electrode 132 is formed of a p-type work function metal (p-metal). The p-metal may have a work function that is greater than about 4.8 eV. For example, the p-metal may include Mo, Ru, In, Pt, PtSi, MoN, WN, or other suitable metals. Alternatively, the dummy gate electrode 132 may be formed of polysilicon doped with a p-type dopant such as boron. In another embodiment, the dummy gate electrode 132 is formed of a mid-gap work function metal (mid-gap metal) having a work function between the n-metal and p-metal. The mid-gap metal may have a work function ranging from about 4.33 to about 4.8 eV. For example, the mid-gap metal may include TiN, NiSi, or other suitable metals.

The dummy gate structures 130 may be implemented for lithography pattern density uniformity. Additionally, the dummy gate structures 130 may function as an isolation structure. In the present embodiment, the dummy gate structures 130 always remain in an off-state condition since the dummy gate electrode 132 is formed of the p-metal or mid-gap metal as compared to the functional gate electrode 122 formed of the n-metal. A band offset between the dummy gate structure 130 and the p-well has a greater or equal to ½ silicon band gap energy difference than that between the functional gate structure 120 and the p-well. It is understood that the semiconductor device 100 may include other known structures and features such as inter-level dielectric (ILD), contact etch stop layer (CESL), interconnection structure, etc., but are not illustrated for the sake of clarity.

Figure 2:
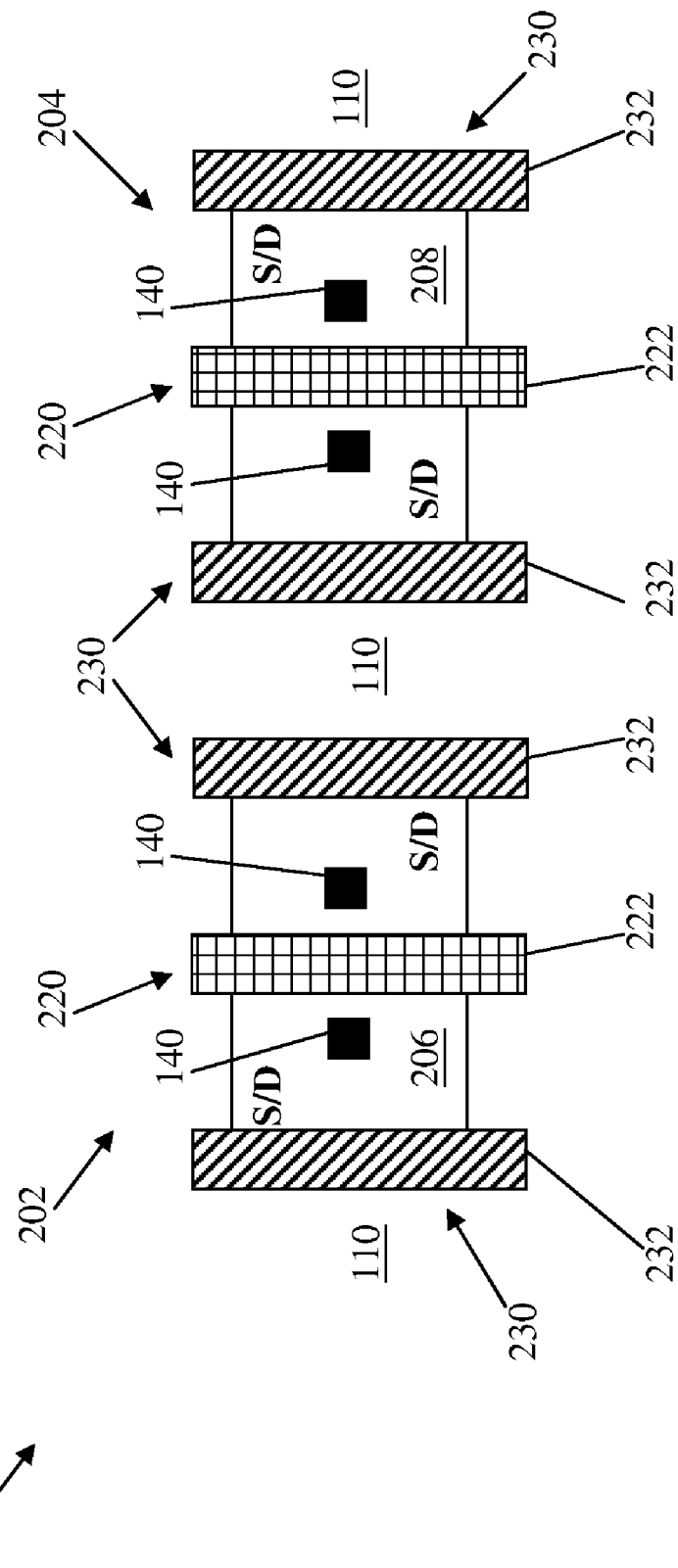

Referring to FIG. 2, illustrated is a top view of a semiconductor device 200. Similar features in FIGS. 1 and 2 are numbered the same for the sake of simplicity and clarity. The semiconductor device 200 includes adjacent/neighboring p-type metal-oxide-semiconductor field-effect transistor (PMOSFET) devices 202 and 204 isolated from each other and from other devices by dummy structures according to an embodiment of the present disclosure. Although only two PMOSFET devices are illustrated, it is understood that more than two devices may be implemented in the semiconductor device 200 as well as reverse type MOSFET devices formed by CMOS technology processing. Further, it is understood that the semiconductor device 200 may also include resistors, capacitors, inductors, diodes, and other suitable microelectronic devices that are typically implemented in integrated circuits. The devices 202 and 204 may be formed within active regions 206 and 208, respectively. The active regions 206 and 208 are defined in a semiconductor substrate.

The semiconductor substrate includes a semiconductor wafer such as a silicon wafer. Alternatively, the substrate may include other elementary semiconductors such as germanium. In an embodiment, the substrate may include an epitaxial layer (epi layer) overlying a bulk semiconductor. Furthermore, the substrate may include a semiconductor-on-insulator (SOI) structure. In various embodiments, the substrate may include a buried layer such as an n-type buried layer (NBL), a p-type buried layer (PBL), and/or a buried dielectric layer including a buried oxide (BOX) layer. In some embodiments, the substrate may include doped features such as an n-well and p-well. In the present embodiment, the substrate includes an n-type doped silicon substrate.

The active regions 206, 208 are surrounded by isolation regions 110, such as shallow trench isolation (STI) features or local oxidation of silicon (LOCOS) features formed in the substrate. The active regions 206, 208 include source and drain regions (S/D regions). A channel underlying a gate structure 220 is defined in the substrate and configured between the source and drain regions. The channel is strained to enable the carrier mobility of the device and enhance the device performance. Particularly, the source and drain regions are formed by an epitaxy (epi) process to achieve the strained channel. In an embodiment, silicon germanium (SiGe) is deposited by an epitaxy process on the silicon substrate to form the source and drain regions. In another embodiment, epi silicon (Si) is deposited on the silicon substrate to form source and drain regions. Further, the source and drain regions may be raised above the surface of the substrate.

The gate structure 220 is formed on the substrate and interposed between the source and drain regions. The gate structure 220 may be referred herein as a functional or operational gate structure. The gate structure 220 may be formed on an n-well. The gate structure 220 includes a gate dielectric and a gate electrode 222 formed on the gate dielectric. The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectric may have a multilayer structure such as one layer of silicon oxide and another layer of high k material.

In an embodiment, the gate electrode 222 is formed of a p-metal work function metal (p-metal) for properly performing as a PMOSFET device. The p-metal may have a work function that is greater than about 4.8 eV. For example, the p-metal may include Mo, Ru, In, Pt, PtSi, MoN, WN, other suitable metals. The gate electrode 222 may have a multilayer structure and may be formed in a multiple-step process using a combination of different processes. The gate electrode 222 may be formed in a "gate first" or "gate last" approach as is known in the art. Alternatively, the gate electrode 222 may optionally include a polysilicon (poly) layer doped with a p-type dopant such as boron.

The semiconductor device 200 further includes dummy gate structures 230 disposed within the active regions 206, 208. That is, an edge of the active region 206, 208 is extended such that it directly underlies the dummy gate structures 230. Accordingly, the epi SiGi or epi Si volume is increased thereby reducing a facet profile proximate the STI 110. Thus, device performance may be improved such as Idsat. Further, the increased volume improves alignment of subsequent contacts 140 formed on the source and drain regions. In the present embodiment, the dummy gate structures 230 include a dummy gate dielectric and a dummy gate electrode 232 formed on the dummy gate dielectric. The dummy gate structures 230 may be formed on the n-well. The dummy gate dielectric is formed of the same material as the gate dielectric of the functional gate structure 220. However, the dummy gate electrode 232 is formed of a different composition than the gate electrode 222 of the functional gate structure 220. In an embodiment, the dummy gate electrode 232 is formed of an n-type work function metal (n-metal). The n-metal may have a work function that is less than about 4.33 eV. For example, the n-metal may include Ti, Al, Zn, Nb, Ag, Mn, Zr, Ta, TiN, TaN, and other suitable metals. Alternatively, the dummy gate electrode 232 may be formed of polysilicon doped with an n-type dopant such as phosphorous or arsenic. In another embodiment, the dummy gate electrode 232 is formed of a mid-gap work function metal (mid-gap metal) having a work function between the n-metal and p-metal. The mid-gap metal may have a work function ranging from about 4.33 to about 4.8 eV. For example, the mid-gap metal may include TiN, NiSi, or other suitable metals.

The dummy gate structures 230 may be implemented for lithography pattern density uniformity. Additionally, the dummy gate structures 230 may function as an isolation structure. In the present embodiment, the dummy gate structures 230 always remain in an off-state condition since the dummy gate electrode 232 is formed of the n-metal or mid-gap metal as compared to the functional gate electrode 222 formed of the p-metal. A band offset between the dummy gate structure 230 and the n-well has a greater or equal to ½ silicon band gap energy difference than that between the functional gate structure 220 and the n-well. It is understood that the semiconductor device 200 may include other known structures and features such as inter-level dielectric (ILD), contact etch stop layer (CESL), interconnection structure, etc., but are not illustrated for the sake of clarity.

Figure 3:
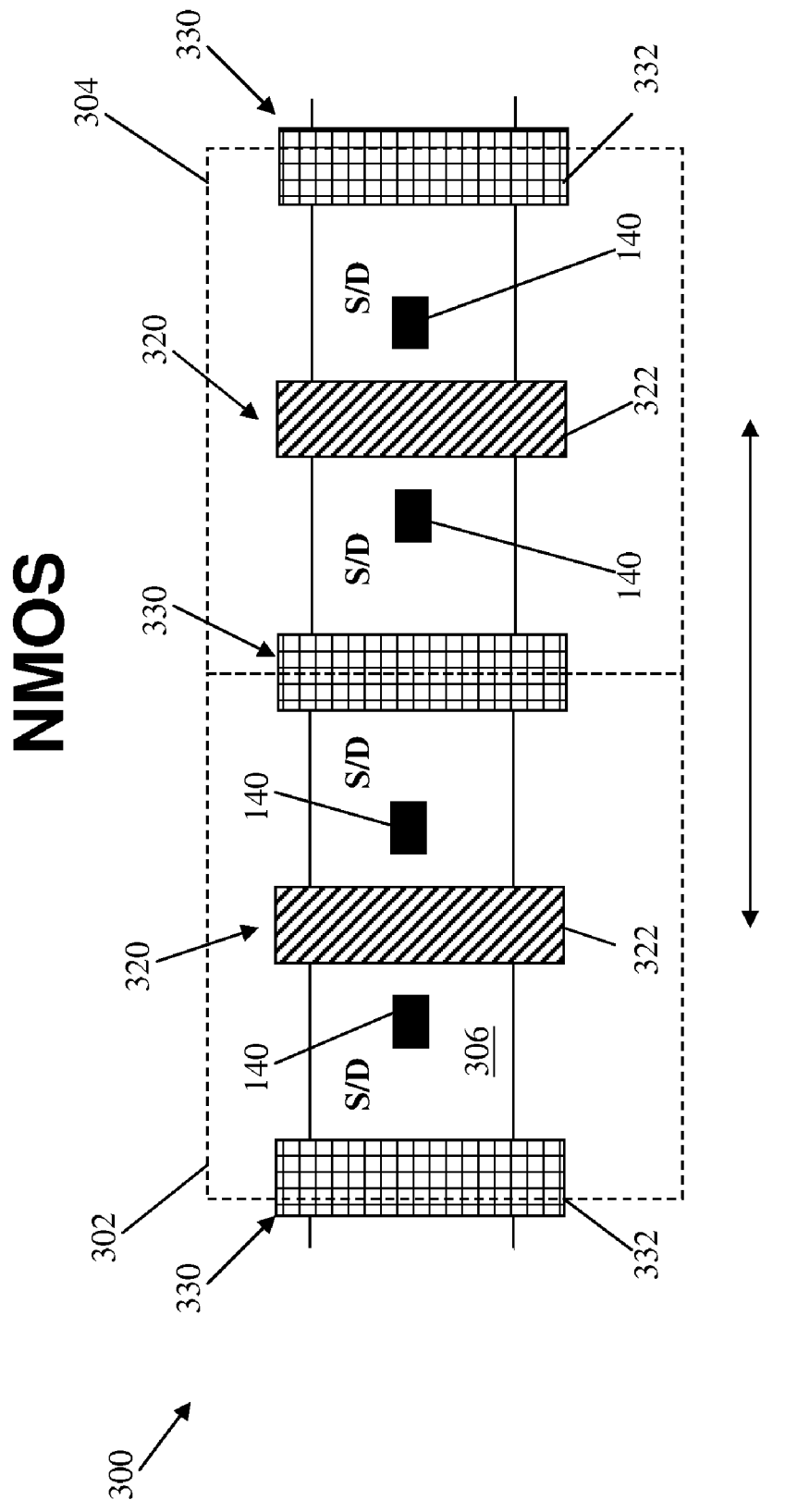

Referring to FIG. 3, illustrated is a top view of a semiconductor device 300. The semiconductor device 300 is similar to the semiconductor device 100 of FIG. 1 except that no isolation regions are implemented to isolate adjacent/neighboring devices. The semiconductor device 300 includes adjacent/neighboring NMOSFET devices 302 and 304 isolated from each other and from other devices by dummy structures according to an embodiment of the present disclosure. Although only two NMOSFET devices are illustrated, it is understood that more than two devices may be implemented in the semiconductor device 300 as well as reverse type MOSFET devices formed by CMOS technology processing. Further, it is understood that the semiconductor device 300 may also include resistors, capacitors, inductors, diodes, and other suitable microelectronic devices that are typically implemented in integrated circuits. The devices 302 and 304 may be formed within an active region 306. The active region 306 is defined in a semiconductor substrate.

The semiconductor substrate includes a semiconductor wafer such as a silicon wafer. Alternatively, the substrate may include other elementary semiconductors such as germanium. In an embodiment, the substrate may include an epitaxial layer (epi layer) overlying a bulk semiconductor. Furthermore, the substrate may include a semiconductor-on-insulator (SOI) structure. In various embodiments, the substrate may include a buried layer such as an n-type buried layer (NBL), a p-type buried layer (PBL), and/or a buried dielectric layer including a buried oxide (BOX) layer. In some embodiments, the substrate may include doped features such as an n-well and p-well. In the present embodiment, the substrate includes a p-type doped silicon substrate.

The active region 306 includes source and drain regions (S/D regions) for each NMOSFET device 302, 304. A channel underlying a gate structure 320 is defined in the substrate and configured between the source and drain regions. The channel is strained to enable the carrier mobility of the device and enhance the device performance. Particularly, the source and drain regions are formed by an epitaxy (epi) process to achieve the strained channel. In an embodiment, silicon carbide (SiC) is deposited by an epitaxy process on the silicon substrate to form the source and drain regions. In other embodiments, silicon carbide (SiC) is deposited by an epitaxy process on the silicon substrate and doped with phosphorous to form the source and drain regions. In another embodiment, silicon phosphide (SiP) is deposited by an epitaxy process on the silicon substrate to form the source and drain regions. In still another embodiment, epi silicon (Si) is deposited on the silicon substrate to form source and drain regions. Further, the source and drain regions may be raised above the surface of the substrate. Moreover, the epi SiC or epi SiP or epi Si have a reduced facet profile since no STI features are implemented to isolate the neighboring NMOSFET devices 302, 304. Thus, device performance may be improved such as Idsat.

The gate structure 320 is formed on the substrate and interposed between the source and drain regions. The gate structure 320 may be referred herein as a functional or operational gate structure. The gate structure 320 may be formed on a p-well. The gate structure 320 includes a gate dielectric and a gate electrode 322 formed on the gate dielectric. The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectric may have a multilayer structure such as one layer of silicon oxide and another layer of high k material.

In the present embodiment, the gate electrode 322 includes an n-type work function metal (n-metal) for properly performing as a NMOSFET device. The n-metal may have a work function that is less than about 4.33 eV. For example, the n-metal may include Ti, Al, Zn, Nb, Ag, Mn, Zr, Ta, TiN, TaN, and other suitable metals. The gate electrode 322 may have a multilayer structure and may be formed in a multiple-step process using a combination of different processes. The gate electrode 322 may be formed in a "gate first" or "gate last" approach as is known in the art. Alternatively, the gate electrode 322 may optionally include a polysilicon (poly) layer doped with an n-type dopant such as phosphorous or arsenic.

The semiconductor device 300 further includes dummy gate structures 330 disposed within the active region 306. The dummy gate structures 330 may be formed on the p-well. In the present embodiment, the dummy gate structures 330 include a dummy gate dielectric and a dummy gate electrode 332 formed on the dummy gate dielectric. The dummy gate dielectric is formed of the same material as the gate dielectric of the functional gate structure 320. However, the dummy gate electrode 332 is formed of a different composition than the gate electrode 322 of the functional gate structure 320. In an embodiment, the dummy gate electrode 332 is formed of a p-type work function metal (p-metal). The p-metal may have a work function that is greater than about 4.8 eV. For example, the p-metal may include Mo, Ru, In, Pt, PtSi, MoN, WN, other suitable metals. Alternatively, the dummy gate electrode 332 may be formed of polysilicon doped with a p-type dopant such as boron. In another embodiment, the dummy gate electrode 332 is formed of a mid-gap work function metal (mid-gap metal) having a work function between the n-metal and p-metal. The mid-gap metal may have a work function ranging from about 4.33 to about 4.8 eV. For example, the mid-gap metal may include TiN, NiSi, or other suitable metals.

The dummy gate structures 330 may be implemented for lithography pattern density uniformity. Additionally, the dummy gate structures 330 may function as an isolation structure, and thus may be referred herein as isolation gate structures associated with isolation transistors. The isolation transistor includes a channel region underlying the isolation gate structure 330 and common S/D regions shared with the neighboring NMOSFET devices 302, 304 at either side. In the present embodiment, it has been observed that the dummy gate structures 330 (e.g., isolation transistors) always remain in an off-state condition since the dummy gate electrode 332 is formed of the p-metal or mid-gap metal as compared to the functional gate electrode 322 formed of the n-metal. A band offset between the dummy gate structure 330 and the p-well has a greater or equal to ½ silicon band gap energy difference than that between the functional gate structure 320 and the p-well. Accordingly, the dummy gate structures 330 ensure that no leakage current occurs between neighboring NMOSFET devices 302, 304. Further, the functional gate structures 220 of the neighboring NMOSFET devices 302, 304 are spaced 340 by a two gate pitch instead of a three gate pitch used in the semiconductor device 100 of FIG. 1. That is, one extra gate pitch is used in the semiconductor device 100 to isolate neighboring devices. Accordingly, more devices may be formed in the same area in the semiconductor device 300 as compared to the semiconductor device 100 of FIG. 1. It is understood that the semiconductor device 300 may include other known structures and features such as inter-level dielectric (ILD), contact etch stop layer (CESL), interconnection structure, etc., but are not illustrated for the sake of clarity.

Figure 4:
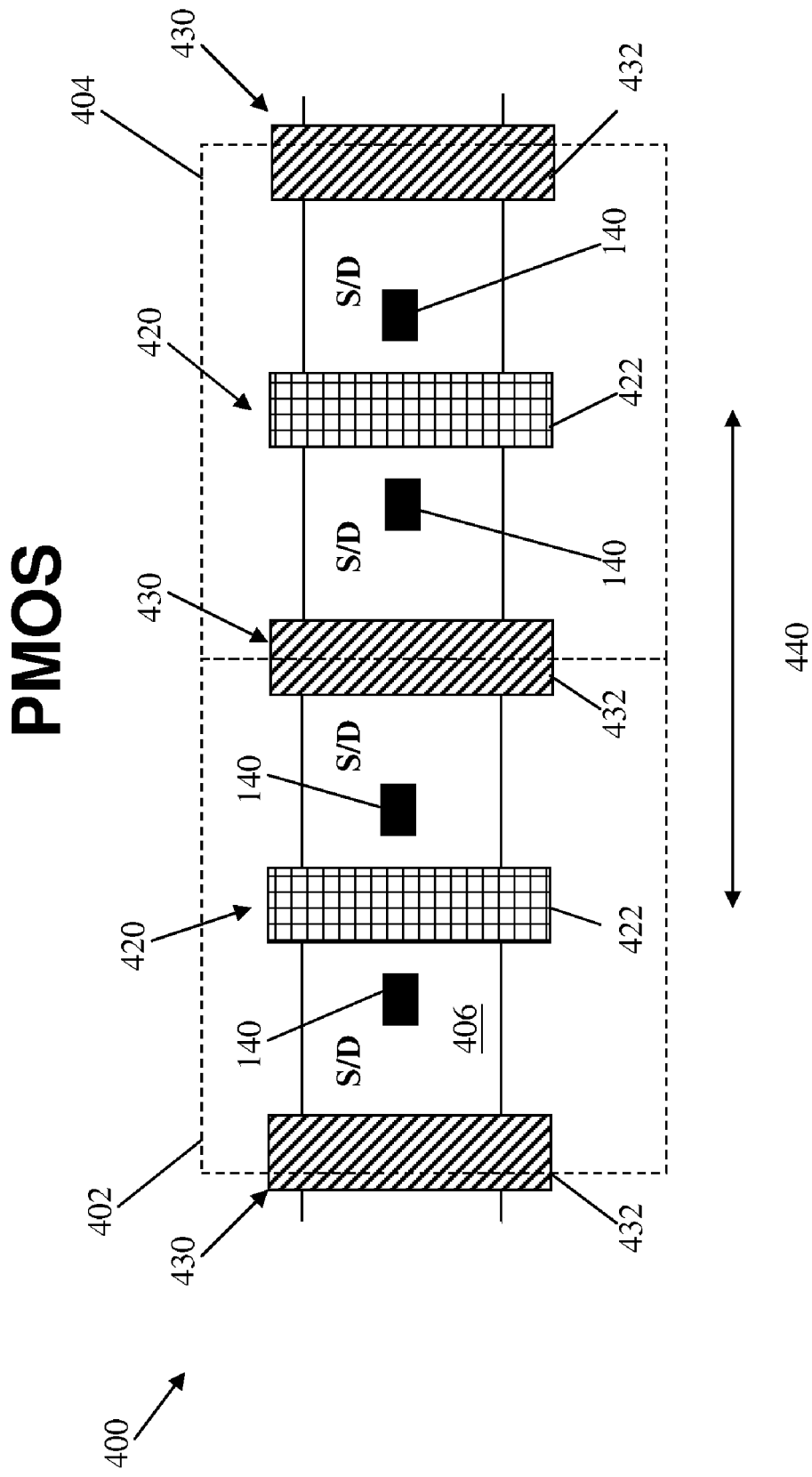

Referring to FIG. 4, illustrated is a top view of a semiconductor device 400. The semiconductor device 400 is similar to the semiconductor device 200 of FIG. 2 except that no isolation regions are implemented to isolate adjacent/neighboring devices. The semiconductor device 400 includes adjacent/neighboring PMOSFET devices 402 and 404 isolated from each other and from other devices by dummy structures according to an embodiment of the present disclosure. Although only two PMOSFET devices are illustrated, it is understood that more than two devices may be implemented in the semiconductor device 400 as well as reverse type MOSFET devices formed by CMOS technology processing. Further, it is understood that the semiconductor device 400 may also include resistors, capacitors, inductors, diodes, and other suitable microelectronic devices that are typically implemented in integrated circuits. The devices 402 and 404 may be formed within an active region 406. The active region 406 is defined in a semiconductor substrate.

The semiconductor substrate includes a semiconductor wafer such as a silicon wafer. Alternatively, the substrate may include other elementary semiconductors such as germanium. In an embodiment, the substrate may include an epitaxial layer (epi layer) overlying a bulk semiconductor. Furthermore, the substrate may include a semiconductor-on-insulator (SOI) structure. In various embodiments, the substrate may include a buried layer such as an n-type buried layer (NBL), a p-type buried layer (PBL), and/or a buried dielectric layer including a buried oxide (BOX) layer. In some embodiments, the substrate may include doped features such as an n-well and p-well. In the present embodiment, the substrate includes a n-type doped silicon substrate.

The active region 406 includes source and drain regions for each PMOSFET device 402, 404. A channel underlying a gate structure 420 is defined in the substrate and configured between the source and drain regions. The channel is strained to enable the carrier mobility of the device and enhance the device performance. Particularly, the source and drain regions are formed by an epitaxy (epi) process to achieve the strained channel. In an embodiment, silicon germanium (SiGe) is deposited by an epitaxy process on the silicon substrate to form the source and drain regions. In another embodiment, epi silicon (Si) is deposited on the silicon substrate to form source and drain regions. Further, the source and drain regions may be raised above the surface of the substrate. Moreover, the epi SiGe or epi Si have a reduced facet profile since no STI features are implemented to isolate the neighboring PMOSFET devices 402, 404. Thus, device performance may be improved such as Idsat.

The gate structure 420 is formed on the substrate and interposed between the source and drain regions. The gate structure 420 may be referred herein as a functional or operational gate structure. The gate structure 420 may be formed on an n-well. The gate structure 420 includes a gate dielectric and a gate electrode 422 formed on the gate dielectric. The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectric may have a multilayer structure such as one layer of silicon oxide and another layer of high k material.

In present embodiment, the gate electrode 422 is formed of a p-metal work function metal (p-metal) for properly performing as a PMOSFET device. The p-metal may have a work function that is greater than about 4.8 eV. For example, the p-metal may include Mo, Ru, In, Pt, PtSi, MoN, WN, other suitable metals. The gate electrode 422 may have a multilayer structure and may be formed in a multiple-step process using a combination of different processes. The gate electrode 422 may be formed in a "gate first" or "gate last" approach as is known in the art. Alternatively, the gate electrode 422 may optionally include a polysilicon (poly) layer doped with a p-type dopant such as boron.

The semiconductor device 400 further includes dummy gate structures 430 disposed within the active region 406. The dummy gate structures 430 may be formed on the n-well. In the present embodiment, the dummy gate structures 430 include a dummy gate dielectric and a dummy gate electrode 432 formed on the dummy gate dielectric. The dummy gate dielectric is formed of the same material as the gate dielectric of the functional gate structure 420. However, the dummy gate electrode 432 is formed of a different composition than the gate electrode 422 of the functional gate structure 420. In an embodiment, the dummy gate electrode 432 is formed of an n-type work function metal (n-metal). The n-metal may have a work function that is less than about 4.33 eV. For example, the n-metal may include Ti, Al, Zn, Nb, Ag, Mn, Zr, Ta, TiN, TaN, and other suitable metals. Alternatively, the dummy gate electrode 432 may be formed of polysilicon doped with an n-type dopant such as phosphorous or arsenic. In another embodiment, the dummy gate electrode 432 is formed of a mid-gap work function metal (mid-gap metal) having a work function between the n-metal and p-metal. The mid-gap metal may have a work function ranging from about 4.33 to about 4.8 eV. For example, the mid-gap metal may include TiN, NiSi, or other suitable metals.

The dummy gate structures 430 may be implemented for lithography pattern density uniformity. Additionally, the dummy gate structures 430 may function as an isolation structure, and thus may be referred herein as isolation gate structures associated with isolation transistors. The isolation transistor includes a channel region underlying the isolation gate structure 430 and common S/D regions shared with the neighboring PMOSFET devices 402, 404 at either side. In the present embodiment, it has been observed that the dummy gate structures 430 (e.g., isolation transistor) always remain in an off-state condition since the dummy gate electrode 432 is formed of the n-metal or mid-gap metal as compared to the functional gate electrode 422 formed of the p-metal. A band offset between the dummy gate structure 430 and the n-well has a greater or equal to ½ silicon band gap energy difference than that between the functional gate structure 320 and the n-well. Accordingly, the dummy gate structures 430 ensure that no leakage current occurs between neighboring PMOSFET devices 402, 404. Further, the functional gate structures 420 of the neighboring PMOSFET devices 402, 404 are spaced 440 by a two gate pitch instead of a three gate pitch used in the semiconductor device 200 of FIG. 2. That is, one extra gate pitch is used in the semiconductor device 200 to isolate neighboring devices. Accordingly, more devices may be formed in the same area in the semiconductor device 400 as compared to the semiconductor device 200 of FIG. 2. It is understood that the semiconductor device 400 may include other known structures and features such as inter-level dielectric (ILD), contact etch stop layer (CESL), interconnection structure, etc., but are not illustrated for the sake of clarity.

Figure 5:
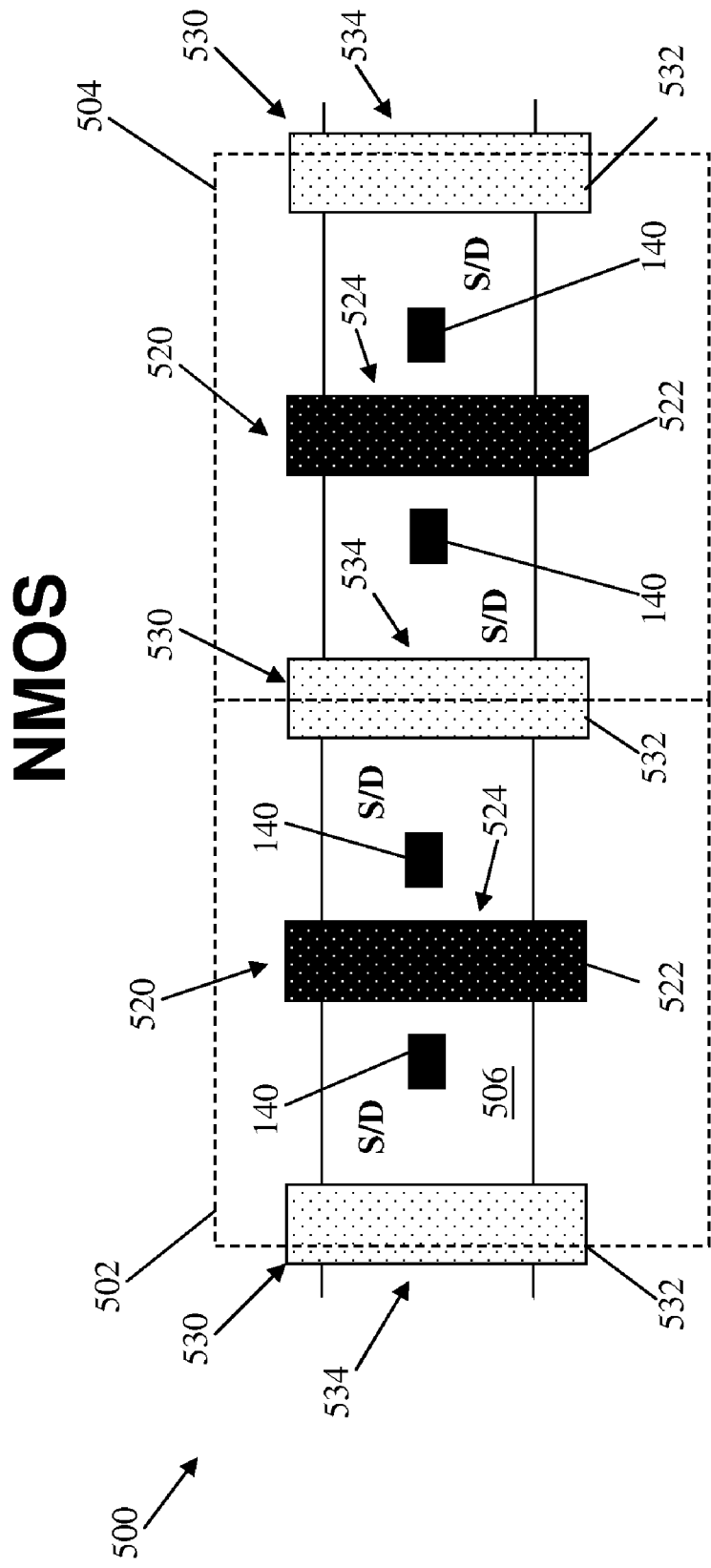

Referring to FIG. 5, illustrated is a top view of a semiconductor device 500. The semiconductor device 500 is similar to the semiconductor device 300 of FIG. 3 except for the differences discussed below. The semiconductor device 500 includes adjacent/neighboring NMOSFET devices 502 and 504 isolated from each other and from other devices by dummy structures according to an embodiment of the present disclosure. Although only two NMOSFET devices are illustrated, it is understood that more than two devices may be implemented in the semiconductor device 500 as well as reverse type MOSFET devices formed by CMOS technology processing. Further, it is understood that the semiconductor device 500 may also include resistors, capacitors, inductors, diodes, and other suitable microelectronic devices that are typically implemented in integrated circuits. The devices 502 and 504 may be formed within an active region 506. The active region 506 is defined in a semiconductor substrate. In the present embodiment, the substrate includes a p-type doped silicon substrate.

The active region 506 includes source and drain regions for each NMOSFET device 502, 504. A channel 524 underlying a gate structure 520 is defined in the substrate and configured between the source and drain regions. The channel 524 is strained to enable the carrier mobility of the device and enhance the device performance. Particularly, the source and drain regions are formed by an epitaxy (epi) process to achieve the strained channel. In an embodiment, silicon carbide (SiC) is deposited by an epitaxy process on the silicon substrate to form the source and drain regions. In other embodiments, silicon carbide (SiC) is deposited by an epitaxy process on the silicon substrate and doped with phosphorous to form the source and drain regions. In another embodiment, silicon phosphide (SiP) is deposited by an epitaxy process on the silicon substrate to form the source and drain regions. In still another embodiment, epi silicon (Si) is deposited on the silicon substrate to form source and drain regions. Further, the source and drain regions may be raised above the surface of the substrate. Moreover, the epi SiC or epi SiP or epi Si do not have a facet profile since no STI features are implemented to isolate the neighboring NMOSFET devices 502, 504. Thus, device performance may be improved such as Idsat.

The gate structure 520 is formed on the substrate and interposed between the source and drain regions. The gate structure 520 may be referred herein as a functional or operational gate structure. The gate structure 520 includes a gate dielectric and a gate electrode 522 formed on the gate dielectric. The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectric may have a multilayer structure such as one layer of silicon oxide and another layer of high k material.

In the present embodiment, the gate electrode 522 includes an n-type work function metal (n-metal) for properly performing as a NMOSFET device. The n-metal may have a work function that is less than about 4.33 eV. For example, the n-metal may include Ti, Al, Zn, Nb, Ag, Mn, Zr, Ta, TiN, TaN, and other suitable metals. The gate electrode 522 may have a multilayer structure and may be formed in a multiple-step process using a combination of different processes. The gate electrode 522 may be formed in a "gate first" or "gate last" approach as is known in the art. Alternatively, the gate electrode 522 may optionally include a polysilicon (poly) layer doped with an n-type dopant such as phosphorous or arsenic.

The semiconductor device 500 further includes dummy gate structures 530 disposed within the active region 506. In the present embodiment, the dummy gate structures 530 include a dummy gate dielectric and a dummy gate electrode 532 formed on the dummy gate dielectric. The dummy gate dielectric is formed of the same material as the gate dielectric of the functional gate structure 520. Additionally, the dummy gate electrode 532 may be formed of the same material as the gate electrode 522. However, a channel region 534 underlying the dummy gate structure 530 has a different doping concentration than the channel region 524 of the functional gate structure 520. For example, the channel region 534 may be doped with a p-type dopant by ion implantation. In the present embodiment, the channel region 534 of the dummy gate structure 530 is doped with a higher doping dosage than the channel region 524 of the functional gate structure 520. In an embodiment, the doping dosage of the channel region 534 ranges from about 7E13 atoms/cm$^2$ to about 1E14 atoms/cm$^2$, and the doping dosage of the channel region 524 is about 5E13 atoms/cm$^2$. Accordingly, a threshold voltage associated with the dummy gate structure 530 can be adjusted to a higher value (more positive for NMOS devices) than a threshold voltage associated with the functional gate structure 520.

The dummy gate structures 530 may be implemented for lithography pattern density uniformity. Additionally, the dummy gate structures 530 may function as an isolation structure, and thus may be referred herein as isolation gate structures associated with isolation transistors. The isolation transistor includes the channel region 534 underlying the isolation gate structure 530 and common S/D regions shared with the neighboring NMOSFET devices 502, 504 at either side. In the present embodiment, it has been observed that the dummy gate structures 530 (e.g., isolation transistors) always remain in an off-state condition since the threshold voltage associated with the dummy gate structure 530 is higher (more positive for NMOS devices) than the threshold voltage associated with the functional gate structure 520. That is, it takes a larger positive voltage to turn on the dummy gate structure 530 as compared to the functional gate structure 520. Accordingly, the dummy gate structures 530 ensure that no leakage current occurs between neighboring NMOSFET devices 502, 504. In some other embodiments, it should be noted that the dummy gate electrode 532 may be formed of a p-metal or mid-gap metal similar to the dummy electrode 332 of FIG. 3. It is understood that the semiconductor device 500 may include other known structures and features such as interlevel dielectric (ILD), contact etch stop layer (CESL), interconnection structure, etc., but are not illustrated for the sake of clarity.

Figure 6:
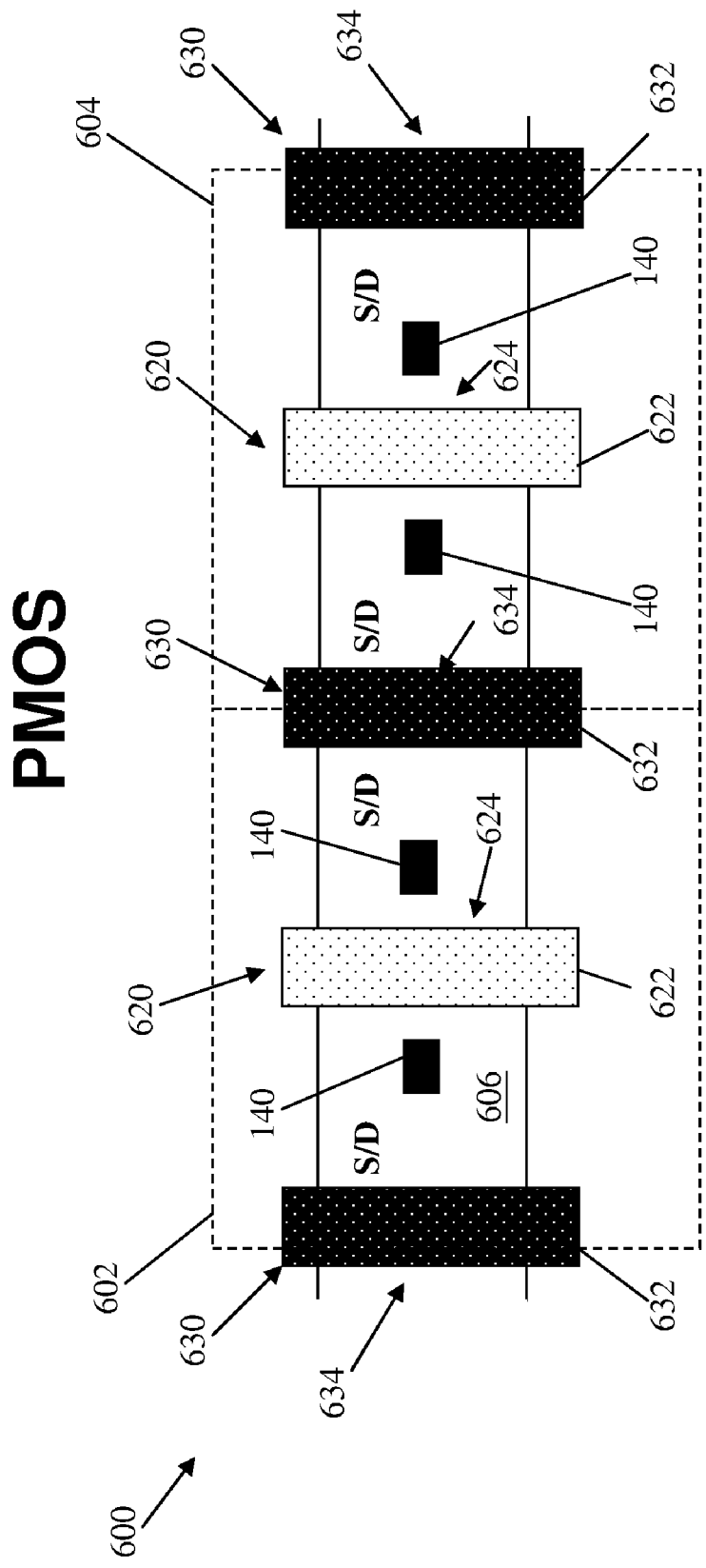

Referring to FIG. 6, illustrated is a top view of a semiconductor device 600. The semiconductor device 600 is similar to the semiconductor device 400 of FIG. 4 except for the differences discussed below. The semiconductor device 600 includes adjacent/neighboring PMOSFET devices 602 and 604 isolated from each other and from other devices by dummy structures according to an embodiment of the present disclosure. Although only two PMOSFET devices are illustrated, it is understood that more than two devices may be implemented in the semiconductor device 600 as well as reverse type MOSFET devices formed by CMOS technology processing. Further, it is understood that the semiconductor device 600 may also include resistors, capacitors, inductors, diodes, and other suitable microelectronic devices that are typically implemented in integrated circuits. The devices 602 and 604 may be formed within an active region 606. The active region 606 is defined in a semiconductor substrate. In the present embodiment, the substrate includes a n-type doped silicon substrate.

The active region 606 includes source and drain regions for each PMOSFET device 602, 604. A channel 624 underlying a gate structure 620 is defined in the substrate and configured between the source and drain regions. The channel 624 is strained to enable the carrier mobility of the device and enhance the device performance. Particularly, the source and drain regions are formed by an epitaxy (epi) process to achieve the strained channel. In an embodiment, silicon germanium (SiGe) is deposited by an epitaxy process on the silicon substrate to form the source and drain regions. In another embodiment, epi silicon (Si) is deposited on the silicon substrate to form source and drain regions. Further, the source and drain regions may be raised above the surface of the substrate. Moreover, the epi SiGe or epi Si have a reduced facet profile since no STI features are implemented to isolate the neighboring PMOSFET devices 602, 604. Thus, device performance may be improved such as Idsat.

The gate structure 620 is formed on the substrate and interposed between the source and drain regions. The gate structure 620 may be referred herein as a functional or operational gate structure. The gate structure 620 includes a gate dielectric and a gate electrode 622 formed on the gate dielectric. The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectric may have a multilayer structure such as one layer of silicon oxide and another layer of high k material.

In present embodiment, the gate electrode 622 is formed of a p-metal work function metal (p-metal) for properly performing as a PMOSFET device. The p-metal may have a work function that is greater than about 4.8 eV. For example, the p-metal may include Mo, Ru, In, Pt, PtSi, MoN, WN, other suitable metals. The gate electrode 622 may have a multilayer structure and may be formed in a multiple-step process using a combination of different processes. The gate electrode 622 may be formed in a "gate first" or "gate last" approach as is known in the art. Alternatively, the gate electrode 622 may optionally include a polysilicon (poly) layer doped with a p-type dopant such as boron.

The semiconductor device 600 further includes dummy gate structures 630 disposed within the active region 606. In the present embodiment, the dummy gate structures 630 include a dummy gate dielectric and a dummy gate electrode 632 formed on the dummy gate dielectric. The dummy gate dielectric is formed of the same material as the gate dielectric of the operational gate structure 620. Additionally, the dummy gate electrode 632 may be formed of the same material as the gate electrode 622. However, a channel region 634 underlying the dummy gate structure 630 has a different doping concentration than the channel region 524 of the functional gate structure 620. For example, the channel region 634 may be doped with a n-type dopant by ion implantation. In the present embodiment, the channel region 534 of the dummy gate structure 530 is doped with a higher doping dosage than the channel region 524 of the functional gate structure 520. In an embodiment, the doping dosage of the channel region 534 ranges from about 7E13 atoms/cm² to about 1E14 atoms/cm², and the doping dosage of the channel region 524 is about 5E13 atoms/cm². Accordingly, a threshold voltage associated with the dummy gate structure 630 can be adjusted to a higher value (more negative for PMOS devices) than a threshold voltage associated with the functional gate structure 620.

The dummy gate structures 630 may be implemented for lithography pattern density uniformity. Additionally, the dummy gate structures 630 may function as an isolation structure, and thus may be referred herein as isolation gate structures associated with isolation transistors. The isolation transistor includes the channel region 634 underlying the isolation gate structure 630 and common S/D regions shared with the neighboring PMOSFET devices 602, 604 at either side. In the present embodiment, it has been observed that the dummy gate structures 630 (e.g., isolation transistors) always remain in an off-state condition since the threshold voltage associated with the dummy gate structure 630 is higher (more negative for PMOS devices) than the threshold voltage associated with the functional gate structure 620. That is, it takes a larger negative voltage to turn on the dummy gate structure 630 as compared to the operational gate structure 620. Accordingly, the dummy gate structures 630 ensure that no leakage current occurs between neighboring PMOSFET devices 602, 604. In some other embodiments, it should be noted that the dummy gate electrode 632 may be formed of an n-metal or mid-gap metal similar to the dummy electrode 432 of FIG. 4. It is understood that the semiconductor device 600 may include other known structures and features such as inter-level dielectric (ILD), contact etch stop layer (CESL), interconnection structure, etc., but are not illustrated for the sake of clarity.

Figure 7:
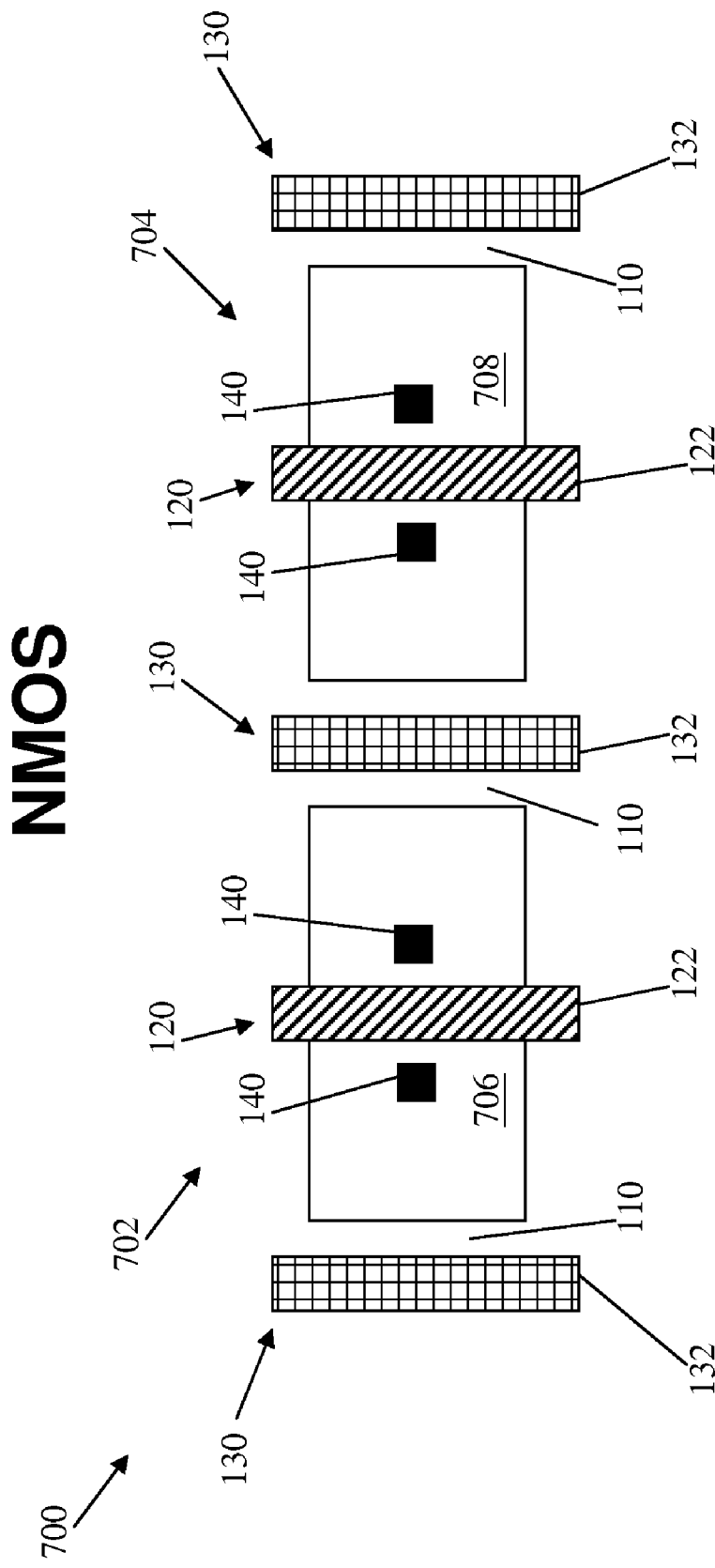

Referring to FIG. 7, illustrated is a top view of a semiconductor device 700. The semiconductor device 700 is similar to the semiconductor device 100 of FIG. 1 except that the dummy gate structures may be formed on the isolation regions. Accordingly, similar features in FIGS. 1 and 7 are numbered the same for the sake of simplicity and clarity. The semiconductor device 700 includes adjacent/neighboring NMOSFET devices 702 and 704 isolated from each other and from other devices by dummy structures according to an embodiment of the present disclosure. Although only two NMOSFET devices are illustrated, it is understood that more than two devices may be implemented in the semiconductor device 700 as well as reverse type MOSFET devices formed by CMOS technology processing. Further, it is understood that the semiconductor device 700 may also include resistors, capacitors, inductors, diodes, and other suitable microelectronic devices that are typically implemented in integrated circuits. The devices 702 and 704 may be formed within active regions 706 and 708, respectively. The active regions 706 and 708 are defined in a semiconductor substrate. In the present embodiment, the dummy gate structures 130 are formed on the isolation regions 110. That is, the active regions 706, 708 are noted extended under the dummy gate structures 130 (as was the case in FIG. 1). Further, the functional gate structures 120 are spaced by a two gate pitch instead of a three gate pitch used in FIG. 1.

Figure 8:
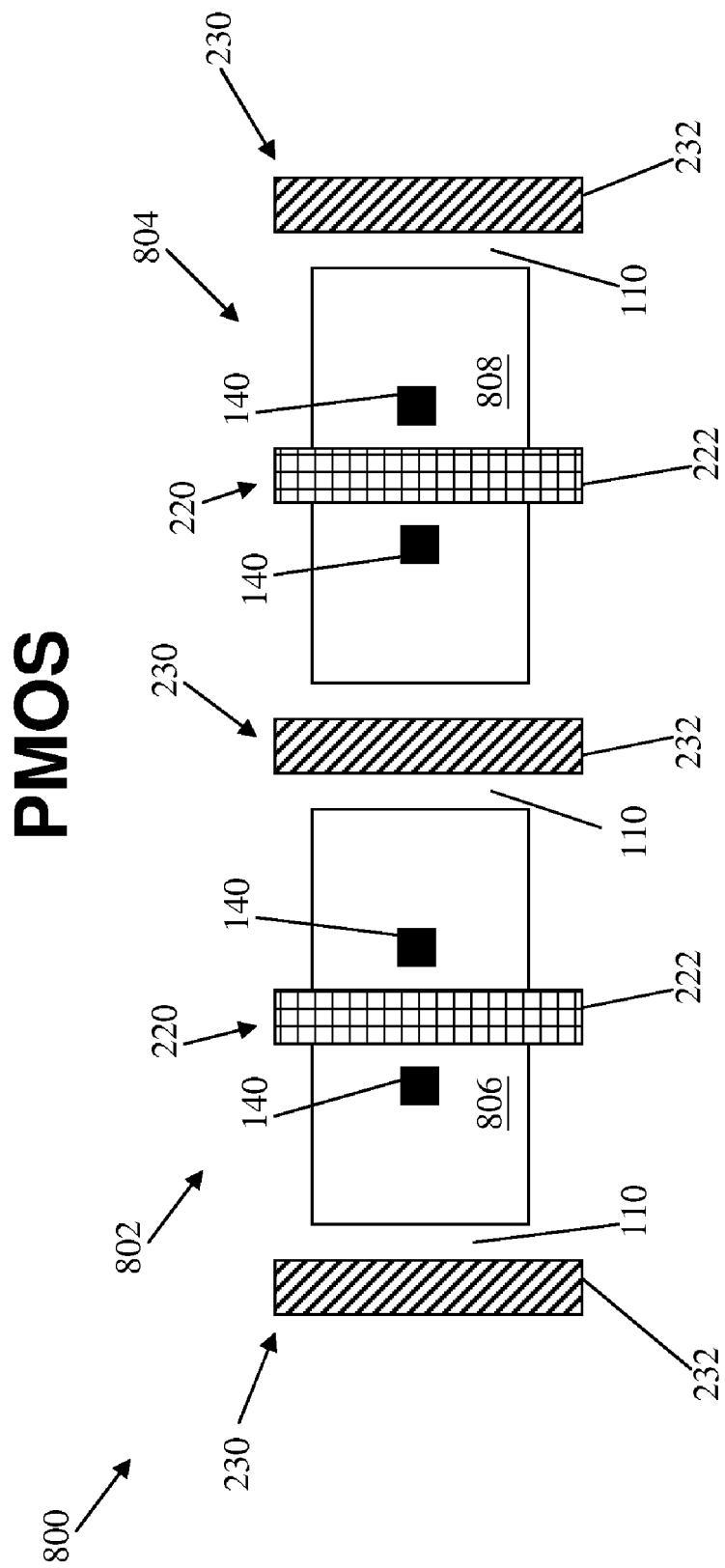

Referring to FIG. 8, illustrated is a top view of a semiconductor device 800. The semiconductor device 800 is similar to the semiconductor device 200 of FIG. 2 except that the dummy gate structures may be formed on the isolation regions. Accordingly, similar features in FIGS. 2 and 8 are numbered the same for the sake of simplicity and clarity. The semiconductor device 800 includes adjacent/neighboring PMOSFET devices 802 and 804 isolated from each other and from other devices by dummy structures according to an embodiment of the present disclosure. Although only two PMOSFET devices are illustrated, it is understood that more than two devices may be implemented in the semiconductor device 800 as well as reverse type MOSFET devices formed by CMOS technology processing. Further, it is understood that the semiconductor device 800 may also include resistors, capacitors, inductors, diodes, and other suitable microelectronic devices that are typically implemented in integrated circuits. The devices 802 and 804 may be formed within active regions 806 and 808, respectively. The active regions 806 and 808 are defined in a semiconductor substrate. In the present embodiment, the dummy gate structures 230 are formed on the isolation regions 110. That is, the active regions 806, 808 are noted extended under the dummy gate structures 230 (as was the case in FIG. 2). Further, the functional gate structures 220 are spaced by a two gate pitch instead of a three gate pitch used in FIG. 2.

In an embodiment of a metal gate structure discussed above with reference to FIGS. 1-8, an interfacial layer, such as silicon oxide, is formed on the substrate before the deposition of the high k dielectric material layer. The silicon oxide may be formed by a thermal oxidation or atomic layer deposition (ALD). The thin silicon oxide layer is formed on the silicon substrate. A high k dielectric material layer is formed on the silicon oxide layer by ALD or other suitable process. A capping layer is formed on the high k dielectric material layer. The capping layer includes lanthanum oxide or other suitable material. A barrier metal layer is formed on the capping layer by PVD or other suitable method. The barrier metal layer includes titanium nitride or other proper material as provided above. A polysilicon layer or a metal layer such as tungsten or aluminum is further formed on the metal gate layer by chemical vapor deposition (CVD), plating, physical vapor deposition (PVD) or other suitable method.

Then the various gate material layers are patterned to form gate structures for both operational devices and the dummy gate structures. The method to pattern the gate material layers includes applying various dry and wet etching steps, using a patterned mask defining various openings. The gate layers within the openings of the patterned mask are removed by the one or etching processes. In one embodiment, the first dry etching process utilizes fluorine-containing plasma to remove the polysilicon or the metal gate layer. The patterned mask is formed on the multiple metal-gate-structure layers. In one example, the patterned mask is a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In another embodiment, the patterned mask layer includes a patterned hard mask layer. In one example, the patterned hard mask layer includes silicon nitride. As one example of forming the patterned silicon nitride hard mask, a silicon nitride layer is deposited on the polysilicon layer by a low pressure chemical vapor deposition (LPCVD) process. The silicon nitride layer is further patterned using a photolithography process to form a patterned photoresist layer and an etching process to etch the silicon nitride within the openings of the patterned photoresist layer. Alternatively, other dielectric material may be used as the patterned hard mask. For example, silicon oxynitride may be used as the hard mask.

Further, one or more ion implantation steps are further performed to form various doped regions, such as doped sources and drains, and/or light doped drain (LDD) features. In one example, the LDD regions are formed after the formation of the gate structure and/or the epi source and drain region, and therefore aligned with the gate structures. A gate spacer may be formed on the sidewalls of the metal gate structure. Then heavy source and drain doping processes are performed to form heavy doped sources and drains, and therefore the heavy doped sources and drains are substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials. silicide are formed on the raised source and drain features to reduce the contact resistance. Then silicide can be formed on the sources and drains by a process including depositing a metal layer, annealing the metal layer such that the metal layer is able to react with silicon to form silicide, and then removing the non-reacted metal layer.

Then an inter-level dielectric (ILD) layer is formed on the substrate and a chemical mechanical polishing (CMP) process is further applied to the substrate to polish the substrate. In another example, an contact etch stop layer (CESL) is formed on top of the gate structures before forming the ILD layer. In one embodiment, the gate structures formed above are final metal gate structure and remain in the final circuit (e.g., "gate first" approach). In another embodiment, the thus formed gate structures are partially removed and then refilled with proper materials for various fabrication consideration such as thermal budget (e.g., "gate last" approach). In this approach, the CMP process is continued until the polysilicon surface is exposed. In another embodiment, the CMP process is stopped on the hard mask layer and then the hard mask is removed by a wet etching process.

A multilayer interconnection (MLI) is formed on the substrate to electrically connect various device features to form a functional circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor devices 100, 200, 300, 400, 500, 600, 700, 800 may be used in various applications such as digital/logic circuits, imaging sensor devices, a hetero-semiconductor device, dynamic random access memory (DRAM) cell, and/or other microelectronic devices (collectively referred to herein as microelectronic devices). Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the different doping concentrations of the channel regions discussed with reference to embodiments of FIGS. 5 and 6 may be alternatively implemented with a high threshold voltage halo implant and/or a well implant.

What is claimed is:

1. An integrated circuit, comprising:
a first operational device having a first transistor, wherein the first transistor includes a first gate having a metal with a first work function selected from a group consisting of an n-type work function, a p-type work function, and a mid-gap work function;
a second operational device having a second transistor, wherein the second transistor includes a second gate having a metal with a second work function selected from a group consisting of an n-type work function, a p-type work function, and a mid-gap work function; and
an isolation transistor disposed between the first and second transistors, wherein the isolation transistor includes an isolation gate having a metal with a third work function selected from the group consisting of an n-type work function, a p-type work function, and a mid-gap work function;
wherein the mid-gap work function is between an n-type work function and a p-type work function;
wherein the third work function is different from one of the first work function and the second work function.

2. The integrated circuit of claim 1, wherein the first and second gates of the respective first and second transistors have metals with n-type work functions;
wherein the isolation gate of the isolation transistor has the metal with one of a p-type work function and a mid-gap work function.

3. The integrated circuit of claim 1, wherein the first and second gates of the respective first and second transistors are doped with a first type dopant, and wherein the isolation gate of the isolation transistor is doped with a second type dopant opposite the first type dopant.

4. The integrated circuit of claim 1, wherein a channel region of the isolation transistor is different than a channel region of one of the first transistor and the second transistor.

5. The integrated circuit of claim 4, wherein the channel region of the one of the first and second transistors is doped with a first doping concentration, and wherein the channel region of the isolation transistor is doped with a second doping concentration greater than the first doping concentration.

6. The integrated circuit of claim 1, wherein the first and second gates of the respective first and second transistors are disposed within an active region;

wherein the isolation gate of the isolation transistor is disposed between the first and second gates and within the active region.

7. The integrated circuit of claim 1, wherein the first gate is disposed within a first active region and the second gate is disposed within a second active region, the first and second active regions being separated by an isolation region;
wherein the isolation gate is disposed within the first active region;
further including another isolation transistor having another isolation gate disposed within the second active region and disposed between the isolation gate and the second gate.

8. The integrated circuit of claim 1, wherein the first gate is disposed within a first active region and the second gate is disposed within a second active region, the first and second active regions being separated by an isolation region;
wherein the isolation gate is disposed within the isolation region.

9. An integrated circuit, comprising:
a first operational device having a first gate of a first composition, wherein the first gate includes a first metal with a first work function;
a second operational device having a second gate of the first composition, wherein the second gate includes a second metal with a second work function; and
an isolation gate disposed between the first and second gates, the isolation gate having a second composition different from the first composition, wherein the isolation gate includes a third metal with a third work function;
wherein the third work function is different from one of the first work function and the second work function.

10. The integrated circuit of claim 9, wherein the first and second work functions are n-type work functions;
wherein the third work function is one of a p-type work function and a mid-gap work function;
wherein the mid-gap work function is between an n-type work function and a p-type work function.

11. The integrated circuit of claim 9, wherein the first and second gates are doped with a first type dopant, and wherein the isolation gate is doped with a second type dopant opposite the first type dopant.

12. The integrated circuit of claim 9, wherein the first and second work functions are p-type work functions;
wherein the third work function is one of an n-type work function and a mid-gap work function;
wherein the mid-gap work function is between an n-type work function and a p-type work function.

13. The integrated circuit of claim 9, wherein the first and second gates are disposed within an active region;
wherein the isolation gate is disposed within the active region.

14. The integrated circuit of claim 9, wherein the first gate is disposed within a first active region and the second gate is disposed within a second active region, the first and second active regions being separated by an isolation region;
wherein the isolation gate is disposed within the first active region;
further including another isolation gate disposed within the second active region and disposed between the isolation gate and the second gate, the another isolation gate having the second composition.

15. The integrated circuit of claim 9, wherein the first gate is disposed within a first active region and the second gate is disposed within a second active region, the first and second active regions being separated by an isolation region;
wherein the isolation gate is disposed within the isolation region.

16. An integrated circuit, comprising:
a semiconductor substrate having a first active region and a second active region;
a first field-effect transistor (FET) device disposed within the first active region, the first FET device having a first functional gate electrode;
a second FET device disposed within the second active region, the second FET device having a second functional gate electrode; and
an isolation gate electrode disposed between the first and second functional gate electrodes, wherein the isolation gate electrode has a first conductivity and includes a first metal having a first work function;
wherein the first and second functional gate electrodes have a second conductivity different from the first conductivity and include a second metal having a second work function;
wherein the first work function is different from the second work function.

17. The integrated circuit of claim 16, wherein the first work function is one of an n-type work function and a mid-gap work function;
wherein the second work function is a p-type work function;
wherein the mid-gap work function is between an n-type work function and a p-type work function.

18. The integrated circuit of claim 16, wherein the first work function is one of a p-type work function and a mid-gap work function;
wherein the second work function is an n-type work function;
wherein the mid-gap work function is between an n-type work function and a p-type work function.

19. The integrated circuit of claim 16, wherein the first conductivity is opposite the second conductivity.

20. The integrated circuit of claim 16, wherein the first and second active regions are a continuous active region, and wherein the isolation gate electrode is disposed within the continuous active region.

21. The integrated circuit of claim 16, further including:
a shallow trench isolation (STI) disposed between the first and second active regions;
another isolation gate electrode of the first conductivity, the another isolation gate electrode disposed within the first active region;
wherein the isolation gate electrode is disposed within the second active region and disposed between the another isolation gate electrode and the second functional gate electrode.

22. The integrated circuit of claim 16, wherein the first and second FET devices are one of:
n-type and wherein the first and second FET devices have one of epi silicon carbide (SiC) source/drain features, SiC doped with phosphorous source/drain features, and silicon phosphide (SiP) source/drain features; and
p-type and wherein the first and second FET devices have silicon germanium (SiGe) source/drain features.

23. The integrated circuit of claim 1, wherein the first and second gates of the respective first and second transistors have metals with p-type work functions;
wherein the isolation gate of the isolation transistor has a metal with one of an n-type work function and a mid-gap work function.

* * * * *